US010622576B2

(12) United States Patent
Peng et al.

(10) Patent No.: US 10,622,576 B2
(45) Date of Patent: Apr. 14, 2020

(54) ORGANIC LIGHT-EMITTING DIODE AND WHITE ORGANIC LIGHT-EMITTING DIODE

(71) Applicant: Industrial Technology Research Institute, Hsinchu (TW)

(72) Inventors: Yu-Jung Peng, Taoyuan (TW); Jiun-Haw Lee, Taipei (TW); Po-Chen Tseng, Miaoli County (TW); Bo-Yen Lin, Taipei (TW); Chi-Feng Lin, New Taipei (TW); Tien-Lung Chiu, Taipei (TW); Ming-Zer Lee, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 453 days.

(21) Appl. No.: 15/451,427

(22) Filed: Mar. 7, 2017

(65) Prior Publication Data

US 2018/0151821 A1 May 31, 2018

(30) Foreign Application Priority Data

Nov. 30, 2016 (TW) .............................. 105139559 A (51) Int. Cl.
*H01L 51/54* (2006.01)
*H01L 51/50* (2006.01)
*H01L 51/00* (2006.01)

(52) U.S. Cl.
CPC ...... *H01L 51/5016* (2013.01); *H01L 51/5004* (2013.01); *H01L 51/5012* (2013.01); *H01L 51/5024* (2013.01); *H01L 51/5028* (2013.01); *H01L 51/5036* (2013.01); *H01L 51/5096* (2013.01); *H01L 51/0054* (2013.01); *H01L 51/0058* (2013.01); *H01L 51/0059* (2013.01); *H01L 51/0065* (2013.01); *H01L 51/0072* (2013.01)

(58) Field of Classification Search
USPC ....... 428/690, 691, 411.4, 336, 917; 427/58, 427/66; 313/500–512; 257/40, 88–104, 257/E51.001–E51.052; 252/301.16–301.35
See application file for complete search history.

(56) References Cited

U.S. PATENT DOCUMENTS

| 9,140,428 | B2 | 9/2015 | Xia et al. | |
| 9,206,170 | B2 | 12/2015 | Yang et al. | |
| 2005/0221116 | A1* | 10/2005 | Cocchi | H01L 51/5036 428/690 |
| 2016/0104855 | A1 | 4/2016 | Ohsawa et al. | |
| 2016/0126463 | A1 | 5/2016 | Kadoma et al. | |

FOREIGN PATENT DOCUMENTS

| CN | 101107726 | 1/2008 |
| CN | 103518270 | 1/2014 |
| TW | I389364 | 3/2013 |
| TW | 201402778 | 1/2014 |
| TW | 201515297 | 4/2015 |
| WO | 2015041157 | 3/2017 |

OTHER PUBLICATIONS

"Office Action of China Counterpart Application," dated Mar. 8, 2019, p. 1-p. 5.
"Office Action of Taiwan Counterpart Application," dated Aug. 9, 2017, p. 1-p. 6.
N. C. Giebink et al., "Intrinsic luminance loss in phosphorescent small-molecule organic light emitting devices due to bimolecular annihilation reactions", Journal of Applied Physics, Feb. 2008, 044509-1~044509-9.
S. H. Lee et al., "Light upconversion by triplet-triplet annihilation in diphenylanthracene-based copolymers", Polymer Chemistry, Sep. 2014, 6898~6904.
T. N. Singh-Rachford et al., "Photon upconversion based on sensitized triplet-triplet annihilation", Coordination Chemistry Reviews, Nov. 2010, 2560~2573.
T. C. Wu et al., "Solid state photon upconversion utilizing thermally activated delayed fluorescence molecules as triplet sensitize", Applied Physics Letters, Jul. 2015, 031103-1~031103-4.
Z. Huang et al., "Hybrid Molecule-Nanocrystal Photon Upconversion Across the Visible and Near-Infrared", Nano Letters, Jul. 2015, 5552~5557.
L. Zhu et al., "Reduced efficiency roll-off in all-phosphorescent white organic light-emitting diodes with an external quantum efficiency of over 20%", Journal of Materials Chemistry C, Feb. 2015, 3304~3310.
Y. Sun et al., "Management of singlet and triplet excitons for efficient white organic light-emitting devices", Nature, Apr. 2006, 908~912.
Hiroki Uoyama et al., "Highly efficient organic light-emitting diodes from delayed fluorescence", Nature, Dec. 2012, 234~240.
Hajime Nakanotani et al., "High-efficiency organic light-emitting diodes with fluorescent emitters", Nature Communications, May 2014, 1~7.
Chaoyu Xiang et al., "Origin of Sub-Bandgap Electroluminescence in Organic Light-Emitting Diodes", small, Aug. 2015, 5439~5443.
Chih-Hung Hsiao et al., "Emitting-layer design of white organic light-emitting devices with single-host material", Journal of Applied Physics, Jul. 2009, 024503-1~024503-7.

(Continued)

*Primary Examiner* — Andrew K Bohaty
(74) *Attorney, Agent, or Firm* — JCIPRNET (57) ABSTRACT

An organic light-emitting diode (OLED) and a white OLED are provided. The OLED sequentially includes an anode, an emission layer, an electron transport layer, and a cathode. The emission layer includes a triplet-triplet annihilation (TTA) material and a donor material. The doubled triplet energy of the TTA material is greater than the singlet energy of the TTA material. The donor material is disposed between the anode and the TTA material and has a second singlet energy and a second triplet energy. A sensitizer is doped in the emission layer or formed between the TTA material and the donor material when a voltage is applied. The sensitizer has a third singlet energy and a third triplet energy. The third singlet energy and the third triplet energy are both smaller than the second singlet energy.

23 Claims, 11 Drawing Sheets

(56) References Cited

OTHER PUBLICATIONS

Jau-Jiun Huang et al., "Orthogonally Substituted Benzimidazole-Carbazole Benzene as Universal Hosts for Phosphorescent Organic Light-Emitting Diodes", Organic Letters, Feb. 2016, 672~675.

Hitoshi Kuma et al., "Blue fluorescent OLED materials and their application for high-performance devices", Science and Technology of Advanced Materials, May 2014, 1~8.

Ajay K. Pandey, "Highly efficient spin-conversion effect leading to energy up-converted electroluminescence in singlet fission photovoltaics", scientific reports, Jan. 2015, 1-6.

Mujeeb Ullah et al., "Singlet Fission and Triplet Exciton Dynamics in Rubrene/Fullerene Heterojunctions: Implications for Electroluminescence", Adv. Electron. Mater, Nov. 2015, 1-9.

Fan Deng et al., "Photon upconversion sensitized by a Ru(II)-pyrenyl chromophore", Philos Trans A Math Phys Eng Sci., Jun. 2015, 1~10.

Ming-Zer Lee et al., The abstract of "Non-doped White Organic Light-emitting Diode with Low Turn-on Voltage by Emitting Layer Design", and the index of PIERS 2016 Shanghai Program, Aug. 2016, 1~179.

Ming-Zer Lee et al., The abstract of "Voltage Reduction and Lifetime Elongation of Blue Organic Light-emitting Device with Triplet-triplet annihilation Host", and the index of PIERS 2016 Shanghai Program, Aug. 2016, 1~8.

* cited by examiner

ORGANIC LIGHT-EMITTING DIODE AND WHITE ORGANIC LIGHT-EMITTING DIODE

CROSS-REFERENCE TO RELATED APPLICATION

This application claims the priority benefit of Taiwan application serial no. 105139559, filed on Nov. 30, 2016. The entirety of the above-mentioned patent application is hereby incorporated by reference herein and made a part of this specification.

TECHNICAL FIELD

The disclosure relates to an organic light-emitting diode (OLED) and a white OLED.

BACKGROUND

The three primary colors, red, green, and blue, are provided to an organic light-emitting diode (OLED) in order to form white light. Along the development of the OLED, efficiency has advanced significantly from the fluorescence system of the first generation and the phosphorescence system of the second generation to the thermally activated delayed fluorescence (TADF) system of the third generation. Both green and red OLEDs have satisfactory efficiency and lifetime, but blue OLED still exhibits lower efficiency and much lower lifetime.

The major reason is due to the exciton-polaron annihilation of blue light device. For example, the triplet exciton energy of blue light is approximately 2.8 eV ($T_1$), and thus its exciton lifetime is long (~µs) and the exciton may interact with a polaron resulting in energy transferring to the polaron ($D_0$). The polaron has already a certain level of energy (~3.3 eV), so a hot polaron ($D_n^*$) may be formed with high energy (>6 eV). Such a hot polaron may break a bonding in an organic material (e.g., the bonding energy of C—N is 3.04 eV merely and thus the bonding is likely to be broken), resulting in short lifetime of the blue phosphorescent OLED.

Similar problems are also recognized in the blue TADF device. As an exciton lifetime is long (~1-10 µs), a reaction of hot exciton-polaron annihilation is inevitable.

Therefore, a behavior to considerably reduce the exciton-polaron annihilation is required, so as to create a blue light OLED and a white OLED with high efficiency and long lifetime.

SUMMARY

In an embodiment of the disclosure, an organic light-emitting diode (OLED) includes an anode, a cathode, an emission layer, an electron transport layer, and a sensitizer. The emission layer is disposed between the anode and the cathode and includes a triplet-triplet annihilation (TTA) material (also called a "TTA material") and a donor material. The TTA material has a first singlet energy and a first triplet energy, and a doubled first triplet energy is greater than the first singlet energy. The donor material is disposed between the anode and the TTA material and has a second singlet energy and a second triplet energy. The electron transport layer is disposed between the cathode and the emission layer. The sensitizer may be doped in the emission layer or formed between the TTA material and the donor material when a voltage is applied. The sensitizer has a third singlet energy and a third triplet energy, and the third singlet energy and the third triplet energy are both smaller than the second singlet energy.

In an embodiment of the disclosure, a white OLED includes an anode, a cathode, an emission layer, an electron transport layer, and a sensitizer. The emission layer is disposed between the anode and the cathode and includes a TTA material and a donor material. The TTA material has a first singlet energy and a first triplet energy, and a doubled first triplet energy is greater than the first singlet energy. The donor material is disposed between the anode and the TTA material and has a second singlet energy and a second triplet energy. The electron transport layer is disposed between the cathode and the emission layer. The sensitizer is doped in the emission layer or formed between the TTA material and the donor material when a voltage is applied. The sensitizer has a third singlet energy and a third triplet energy, and the third singlet energy and the third triplet energy are both smaller than the second singlet energy. Here, the third singlet energy emits a yellow light or a yellow green light, and the third triplet energy is transferred to the TTA material for sensitizing a triplet-triplet annihilation up-conversion (TTAUC), such that the first singlet energy emits a blue light; thereby, a white light is generated by mixing the yellow light with the blue light or mixing the yellow green light with the blue light.

Several exemplary embodiments accompanied with figures are described in detail below to further describe the disclosure in details.

BRIEF DESCRIPTION OF THE DRAWINGS

The accompanying drawings are included to provide a further understanding, and are incorporated in and constitute a part of this specification. The drawings illustrate exemplary embodiments and, together with the description, serve to explain the principles of the disclosure.

DETAILED DESCRIPTION OF DISCLOSURED EMBODIMENTS

Figure 1:
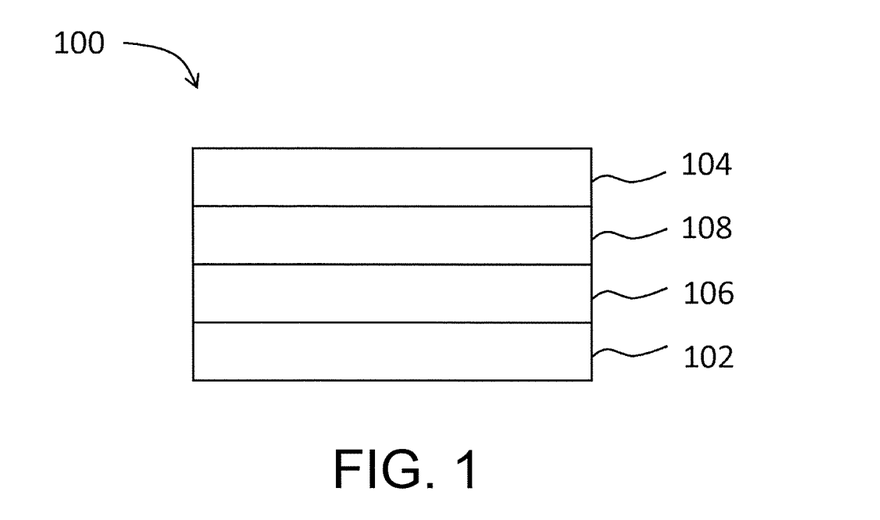
FIG. 1 is a schematic diagram illustrating an organic light-emitting diode (OLED) according to an exemplary embodiment of the disclosure.

FIG. 1 is a schematic diagram illustrating an organic light-emitting diode (OLED) according to an exemplary embodiment.

Referring to FIG. 1, an OLED 100 provided in the embodiment includes an anode 102, a cathode 104, an emission layer 106, an electron transport layer 108, and a sensitizer (not shown). The emission layer 106 is disposed between the anode 102 and the cathode 104, and the emission layer 106 includes a triplet-triplet annihilation (TTA) material and a donor material. The TTA material has a first singlet energy and a first triplet energy, and a doubled first triplet energy is greater than the first singlet energy. The donor material is disposed between the anode and the TTA material and has a second singlet energy and a second triplet energy. The electron transport layer 108 is disposed between the cathode 104 and the emission layer 106. The sensitizer may be doped in the emission layer 106 or formed between the TTA material and the donor material when a voltage is applied. The sensitizer has a third singlet energy and a third triplet energy, and the third singlet energy and the third triplet energy are both smaller than the second singlet energy.

The third singlet energy and the third triplet energy of the sensitizer are between the first triplet energy and the first singlet energy of the TTA material. The sensitizer may be a phosphorescent material, a thermally activated delayed fluorescence (TADF) material, or exciplex. The phosphorescent material as the sensitizer may be doped in a host material (in order to prevent concentration quenching) and then doped in the emission layer 106. The host material includes but is not limited to 4,4'-N,N'-dicarbazole-biphenyl (CBP) with a singlet energy of 3.1 eV and a triplet energy of 2.58 eV. The donor material used together with the phosphorescent material is determined by the highest occupied molecular orbital (HOMO) of the phosphorescent material, and a HOMO of the donor material must be close to the HOMO of the phosphorescent material, such that a carrier may be injected directly to lower a driving voltage. If the TADF serves as the sensitizer, the phosphorescent material may be simply replaced with the TADF.

The phosphorescent material includes but is not limited to tri[2-phenylpyridinato-C2,N]iridium(III) (Ir(ppy)$_3$) or Bis (1-phenyl-isoquinoline) (Acetylacetonato)iridium(III) (Ir (piq)2acac), wherein the Ir(piq)2acac has a singlet energy of 2.44 eV and a triplet energy of 1.93 eV. The TADF material includes but is not limited to 2,3,5,6-tetrakis(3,6-diphenyl-carbazol-9-yl)-1,4-dicyano-benzene (4CzTPN-Ph), 2-(9-phenyl-9H-carbazol-3-yl)-10,10-dioxide-9H-thioxanthen-9-one (TXO-PhCz), or 2-[4-(diphenylamino) phenyl]-10,10-dioxide-9H-thioxanthen-9-one (TXO-TPA), wherein the TXO-TPA has a singlet energy of 2.5 eV and a triplet energy of 2.46 eV.

The exciplex as the sensitizer may be formed between the TTA material and the donor material when a voltage is applied between the anode 102 and the cathode 104.

Moreover, in one embodiment, an electron mobility of the electron transport layer is greater than $10^{-6}$ cm/Vs. Additionally, in an embodiment of the disclosure, an additional layer may be formed as well, e.g., a blocking layer disposed between the TTA material and the sensitizer. The blocking layer may serve as a triplet transporting and singlet blocking layer, such that the triplet energy of the sensitizer may be transferred to the TTA material and a quenching of the first singlet energy of the TTA material with the sensitizer is reduced, which is conducive to subsequent reactions. The blocking layer has a fourth singlet energy and a fourth triplet energy, the fourth singlet energy is greater than the first singlet energy of the TTA material, and the fourth triplet energy is greater than the first triplet energy of the TTA material. The blocking layer, for example, is 1-(2,5-dimethyl-4-(1-pyrenyl) phenyl)pyrene (DMPPP) with a chemical structure illustrated below:

In addition, the OLED provided in the embodiment may further includes a hole injection layer, an electron injection layer, an electron blocking layer, or a hole blocking layer. The additional layers are well known to people having ordinary skill in the art, and hence a detailed description of the additional layers is omitted here.

In the following descriptions, in order to better understand the OLED or a white OLED in the embodiments of the disclosure, the exciplex is exemplarily described as the sensitizer, which should not be construed as a limitation to one or more exemplary embodiments of the disclosure.

In an embodiment of the disclosure, the emission layer 106 includes the TTA material with a doubled first triplet energy greater than its first singlet energy, such that through an arrangement of each layer (the anode 102, the emission layer 106 (the donor material and the TTA material), the electron transport layer 108, and the cathode 104), the exciplex is formed between the donor material and the TTA material when a voltage is applied between the anode 102 and the cathode 104, and thereby the triplet energy of the exciplex may be transferred to the TTA material, and the quenching of the first singlet energy of the TTA material with the sensitizer is reduced, which is conducive to subsequent reactions. The donor material may include but may not be limited to 4,4',4"-tris(3-methylphenylphenyl amino)triphenylamine (m-MTDATA), N1,N1'-(biphenyl-4,4'-diyl) bis(N1-phenyl-N4,N4-di-m-tolylbenzene-1,4-diamine) (DNTPD), 4,4',4"-Tris(N-(naphthalen-1-yl)-N-phenylamino)triphenylamine (1T-NATA), or 4,4',4"-Tris(2-naphthyl (phenyl)amino)triphenylamine (2T-NATA).

The third singlet energy and the third triplet energy of the exciplex acting as the sensitizer are inter-convertible, the third singlet energy and the third triplet energy are both between the first singlet energy and the first triplet energy of the TTA material, and a first color light, for example, a red light or a green light with a long wavelength, is emitted by the third singlet energy, which should however not be construed as a limitation to the disclosure. When the third triplet energy is transferred to the TTA material, a triplet-triplet annihilation up-conversion (TTAUC) is sensitized, and thereby a second color light is emitted by the first singlet energy of the TTA material. In other words, compared to the exciplex, the TTA material has a broader energy gap range, the TTA material with a broad energy gap is responsible for emitting lights only and not responsible for carrier transport, and its lifetime is thus increased. In addition, compared to the broad energy gap of the TTA material, an energy gap of the exciplex falls within a narrower range of energy gap; therefore, the exciplex may be formed without consuming significant energy, and a series of light-emitting reactions may then be triggered.

In the embodiment, since a light is emitted by the singlet energy with a short exciton lifetime (~ns), an exciton-polaron annihilation behavior is considerably reduced, and a light-emitting lifetime is enhanced.

Furthermore, according to the embodiment of the disclosure, the third triplet energy of the exciplex is transferred to the TTA material for the TTAUC; hence, unlike the related art, the embodiment discloses that the triplet energy accounting for 75% of the total energy may not be wasted, and a power efficiency is significantly increased.

On the other hand, the emitted second light may be, for example, a blue light with a short wavelength, a red light with a long wavelength, a yellow light with a long wavelength, or a yellow green light with a long wavelength according to different choices of the TTA materials, which should however not be construed as a limitation to the disclosure. The TTA material may be used in the emission layer together with a dopant if necessary (i.e., the emission layer may further include the dopant), the dopant has a fifth singlet energy and a fifth triplet energy, and the fifth singlet energy and the fifth triplet energy are both smaller than the first singlet energy. An emission layer emitting the red light includes but is not limited to having a red fluorescent dopant and rubrene (acting as the TTA material). The red fluorescent dopant includes but is not limited to pentacene or 4-(Dicyanomethylene)-2-tert-butyl-6-(1,1,7,7-tetramethyljulolidin-4-yl-vinyl)-4H-pyran (DCJTB). An emission layer emitting the yellow light or the yellow green light includes but is not limited to rubrene (acting as the TTA material). An emission layer emitting the blue light includes but is not limited to having a blue fluorescent dopant and rubrene (acting as the TTA material). The blue fluorescent dopant includes but is not limited to 4,4'-bis(4-diphenylaminostyryl)biphenyl (DPAVBi) or 1,4,7,10-Tetra(tert-butyl)perylene (TBP). The DPAVBi has a chemical structure illustrated below:

In addition, when the blue light is emitted by the emission layer, the TTA material includes but is not limited to anthracene derivative, pyrene derivative, or perylene derivative. The anthracene derivative includes but is not limited to 9,10-Di(2-naphthyl)anthracene (ADN), 2-methyl-9,10-Di(2-naphthyl)anthracene, 2-tert-butyl-9,10-Di(2-naphthyl)anthracene, or 9,9'-dianthracene.

In addition, since both the sensitizer (e.g., the phosphorescent material, the TADF material, or the exciplex) and the TTA material are able to emit light, a white light may be generated by mixing color lights, and thereby a white OLED is obtained. For example, when the first color light is the yellow light or the yellow green light, and the second light is the blue light, the white light is generated by mixing the yellow light with the blue light or mixing the yellow green light with the blue light, and thereby the white OLED is obtained. The TTA material emitting the yellow light or the yellow green light includes but is not limited to rubrene.

In terms of adjusting the white light, other materials may be added to a layer or a plurality of layers; for example, DCJTB may be added.

Furthermore, the embodiment provides that a transparent electrode may be used as the anode 102 or the cathode 104 by the OLED 100. The transparent electrode may be made of indium tin oxide (ITO) or indium zinc oxide (IZO), etc. However, the disclosure is not limited hereto, and a non-transparent electrode material with a high reflectivity may also be selected according to a light-emitting direction. The cathode 104 may be made of a single layer material or plural layers of materials. Take a double-layer material for example, the cathode may be made of a LiF layer and an A 1 layer, which should however not be construed as a limitation to the disclosure.

The embodiment provides that the OLED 100 may be fabricated by forming various layers on a substrate through applying appropriate methods, for instance, a method of vacuum deposition such as thermal evaporation. In addition, a rigid substrate or a flexible substrate may be selected as the substrate. The rigid substrate is, for example, glass or silicon wafer, and the flexible substrate is, for example, plastic.

Materials and methods known to be used to fabricate the OLED are adopted in specific experimental examples and comparative examples of the embodiment, so as to ensure effects provided in the embodiments of the disclosure, but the disclosure is not limited thereto.

The OLED fabricated in the following experimental example and comparative example may be measured through an estimation method below:

<Voltage-Luminance Curve Estimation Method>

A power supply (Keithley 2400) is connected to an OLED device, and the device emits lights when a voltage or an electric current is provided. The electric current and the voltage passing through the OLED device may be recorded when the OLED is connected to the power supply and communicates with a computer, and the light-emitting luminance of the device is measured by using a spectroscope spectrometer (Minolta CS-1000).

<Emission Spectrum Estimation Method>

The OLED device is connected with the power supply (Keithley 2400), and the device emits lights when the voltage is provided. After that, an emission spectrum of the device is estimated by the spectroscope spectrometer (Minolta CS-1000).

<Method of Estimating Characteristics of OLED Turning-Off Moment>

An electrical pulse is applied to the OLED device by using a signal generator, and a light signal emitted by the OLED is detected through a photomultiplier, transformed into an electrical signal, and displayed on an oscilloscope for interpretation.

Fabrications of the OLED in the experimental examples and the comparative example are explained below.

Experimental Example 1

A patterning process is applied to a first glass substrate with 100 nm of ITO formed on its surface, so as to define the location of an electrode. An ITO electrode is used as the anode in Experimental Example 1. The patterning process may be completed through adopting a plurality of conventional methods. Then, deionized water, acetone, and isopropyl alcohol are applied respectively for cleansing for 10 minutes. An ITO surface is treated by using oxygen plasma before thermal evaporation, so as to lower the energy blocking between the ITO and the next layer. Afterwards, the thermal evaporation is performed in a vacuum chamber with a pressure less than $8 \times 10^{-6}$ torr and a deposition rate controlled at 1 Å/s, and a donor material with a thickness of 30 nm, a TTA material with a thickness of 10 nm, and an electron transport layer with a thickness of 20 nm are sequentially formed.

The donor material in the emission layer in the experimental example 1 is 4,4',4''-tris(3-methylphenylphenylamino)triphenylate (m-MTDATA) with the structure illustrated below:

The TTA material in the emission layer has the following chemical structure of 9,10-bis(2-naphthalenyl)anthracene (ADN):

The electron transport layer has the following chemical structure of 4,7-diphenyl-1,10-phenanthroline (Bphen):

A second glass substrate with 0.9 nm LiF/100 nm Al formed on its surface covers the first glass substrate with the above layers, and a packaging process is performed in a glove box full of nitrogen (a concentration of oxygen and water vapor <0.5 ppm), so as to complete the fabrication of the OLED provided in Experimental Example 1.

Experimental Example 2

Similar methods used and similar layers provided in Experimental Example 1 are basically applied to an OLED in Experimental Example 2; nevertheless, the TTA material used in Experimental Example 1 is replaced with a TTA material emitting the yellow green light—rubrene(5,6,11,12-tetraphenyltetracene), and a chemical structure thereof is:

Experimental Example 3

Similar methods used and similar layer structures provided in Experimental Example 1 are basically applied to an OLED in Experimental Example 3; nevertheless, the TTA material used in Experimental Example 1 is replaced with rubrene, and DCJTB (10% (a volume percentage)) used as a red fluorescent dopant is doped in the emission layer. A chemical structure of DCJTB is:

Comparative Example

Similar methods used and similar layer structures provided in Experimental Example 1 are basically applied to an OLED in the Comparative Example; nevertheless, m-MTDATA in Experimental Example 1 is replaced with a commonly-used hole transporting material, for example, N,N'-di(1-naphthyl)-N,N'-diphenyl benzidine (NPB).

<Analysis of Characteristics>

Figure 2A:
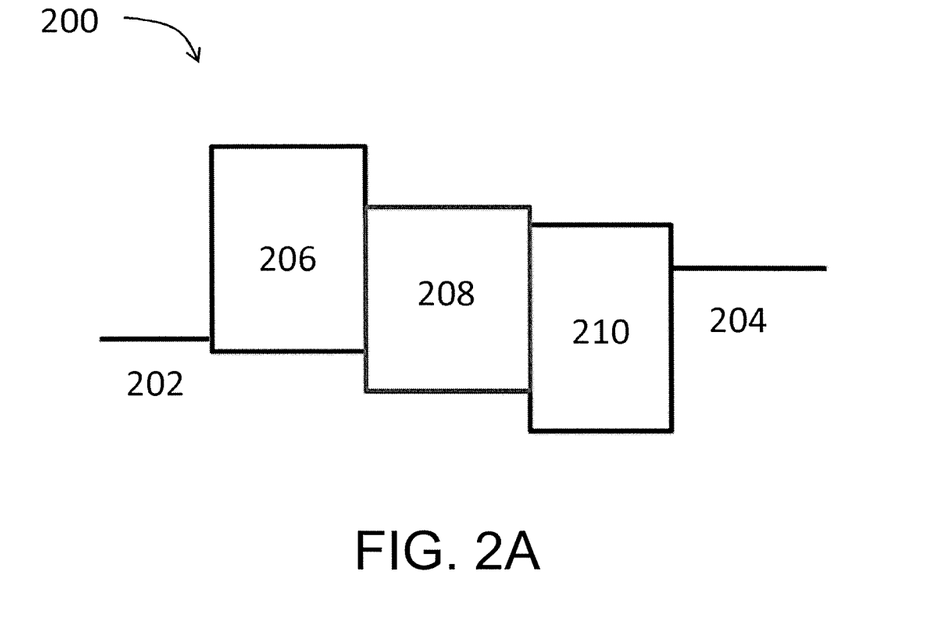
FIG. 2A is a schematic diagram illustrating energy bands of an OLED according to Experimental Example 1 of the disclosure.

FIG. 2A is a schematic diagram illustrating energy bands of an OLED according to Experimental Example 1.

Referring to FIG. 2A, an OLED 200 in Experimental Example 1 includes an anode 202, a cathode 204, a donor material 206, a TTA material 208, and an electron transport layer 210. The anode 202 is an ITO electrode, the cathode 204 is a LiF/Al electrode, the donor material 206 is m-MTDATA, the TTA material 208 is ADN, and the electron transport layer 210 is Bphen.

When electrons and holes are injected into the OLED 200 respectively from the cathode 204 and the anode 202, the electrons enter the TTA material 208 from the electron transport layer 210. ADN acting as the TTA material 208 has the first singlet energy and the first triplet energy. When the electrons reach an interface between m-MTDATA and AND, the electrons and holes are recombined on the interface, and the exciplex is formed. The exciplex has the third singlet energy and the third triplet energy. The third singlet energy emits the yellow light or the yellow green light (peak value ~550 nm), the third triplet energy is transferred to ADN, and the first singlet energy of ADN emits the blue light through the TTAUC. The short singlet exciton lifetime indicates the mild exciton-polaron annihilation, and a long lifetime of the OLED 200 may thus be possible.

Figure 2B:
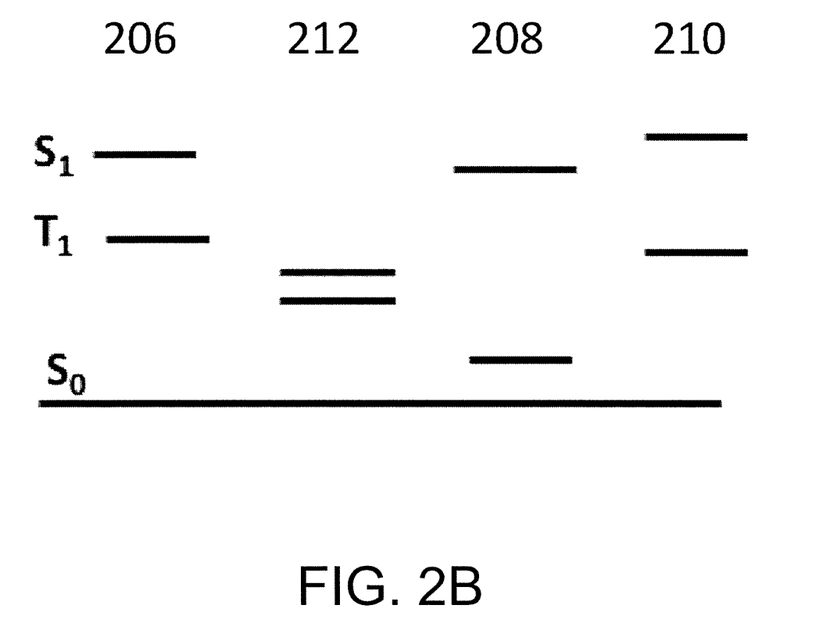
FIG. 2B is a schematic diagram illustrating singlet and triplet energy levels of each material of an OLED according to Experimental Example 1 of the disclosure.

FIG. 2B is a schematic diagram illustrating singlet and triplet energy levels of each material of an OLED according to Experimental Example 1.

Referring to FIG. 2B, in the schematic diagram illustrating energy levels in FIG. 2B, a ground state energy level $S_0$, a singlet energy level $S_1$, and a triplet energy level $T_1$ are included, and the singlet energy level and the triplet energy level of the donor material 206, the exciplex 212, the TTA material 208, and the electron transport layer 210 are sequentially arranged from left to right with values listed in Table 1.

TABLE 1

| | Donor Material 206 | Exciplex 212 | TTA Material 208 | Electron Transport Layer 210 |
|---|---|---|---|---|
| $S_1$ (eV) | 3.1 | 2.2 | 2.8 | 3.5 |
| $T_1$ (eV) | 2.7 | Not measured* | 1.7 | 2.5 |

*Generally speaking, the triplet energy level of the exciplex is less than 2.2 eV and greater than 1.7 eV.

Figure 3:
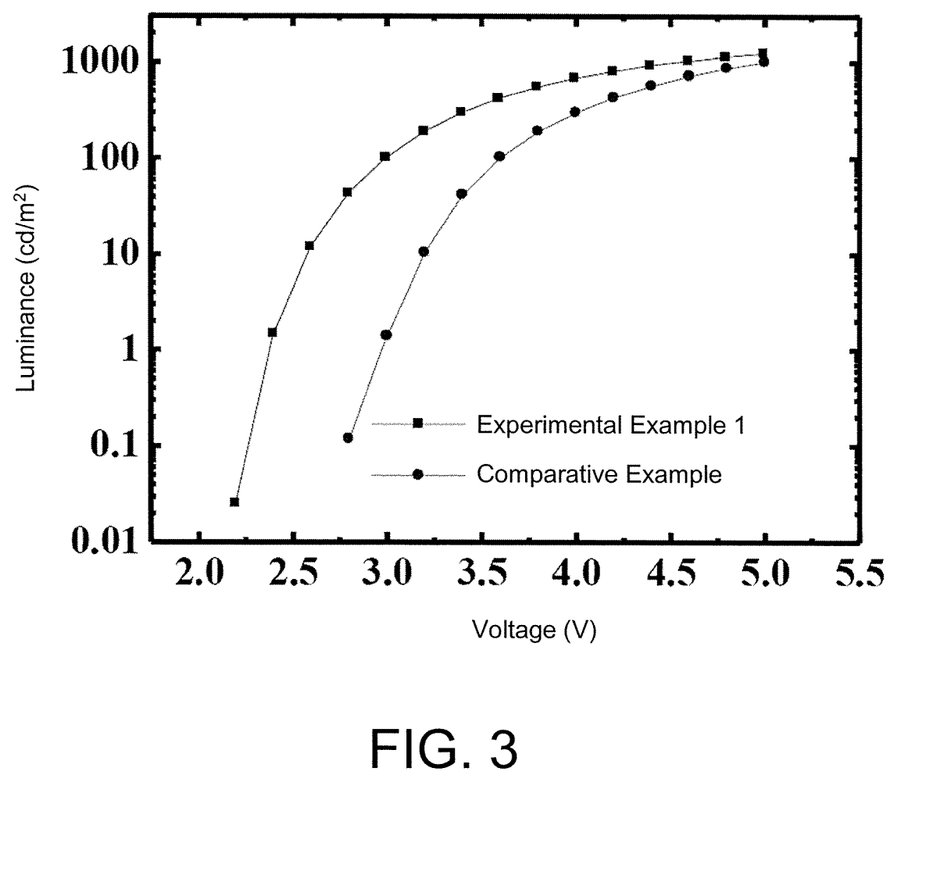
FIG. 3 is a voltage-luminance curve diagram of an OLED according to Experimental Example 1 and Comparative Example of the disclosure.

FIG. 3 is a voltage-luminance curve diagram of an OLED according to Experimental Example 1 and Comparative Example.

Referring to FIG. 3, when light-emitting characteristics of the OLEDs under a low voltage in Experimental Example 1 and Comparative Example of the embodiment are compared, it can be seen that the OLED of Experimental Example 1 already begins to emit lights at the lowest voltage of 2.2V. On the contrary, in the OLED of the Comparative Example, the m-MTDATA in Experimental Example 1 is replaced with NPB because an energy difference of HOMO between NPB and ADN and a difference of the lowest unoccupied molecular orbital (LUMO) between NPB and ADN are insignificant. Therefore, no exciplex is generated between NPB and ADN, such that the driving voltage considerably increases to 2.8V, similar to the singlet energy of the ADN material (2.8 eV).

Figure 4:
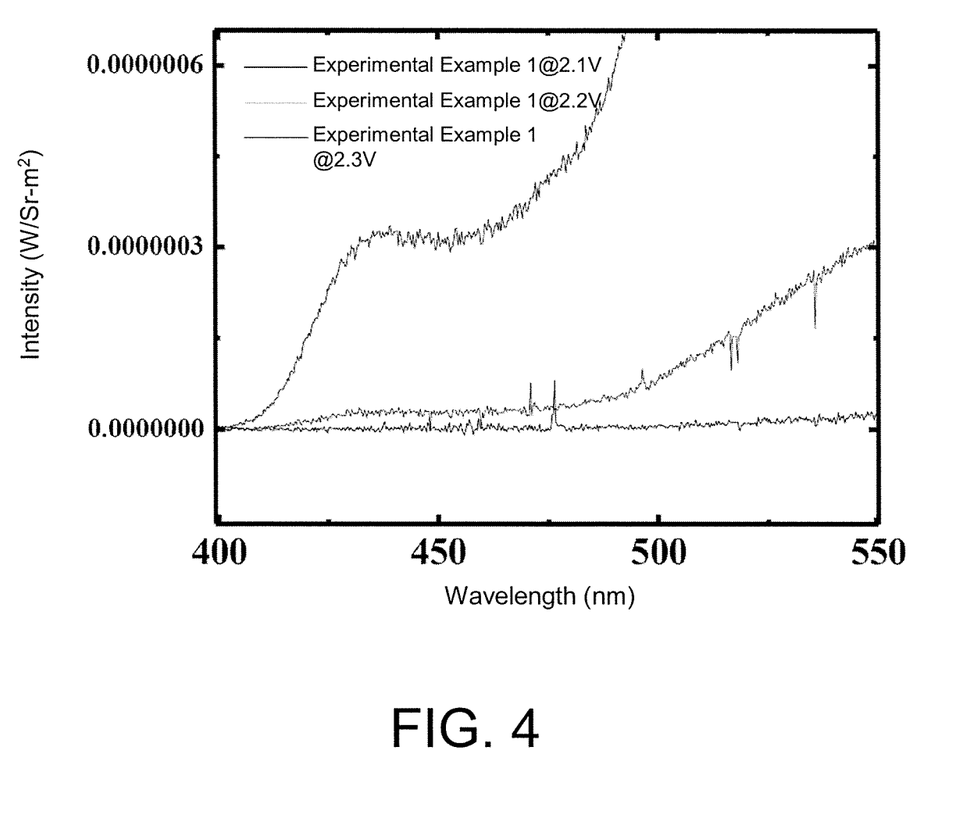
FIG. 4 illustrates an emission spectrum of an OLED according to Experimental Example 1 of the disclosure.

FIG. 4 illustrates an emission spectrum of an OLED according to Experimental Example 1. FIG. 4 illustrates a blue light spectrum of the OLED under low voltages of 2.1V, 2.2V, and 2.3V according to Experimental Example 1 of the disclosure, wherein the bottommost line represents an outcome of the 2.1V voltage, the middle line represents an outcome of the 2.2V voltage, and the uppermost line represents an outcome of the 2.3V voltage.

Referring to FIG. 4, in addition to an emission of the exciplex, the blue light is also observed. Nevertheless, direct recombined emission under such a low voltage is impossible because the emission of the exciplex near a peak value of 550 nm corresponds to an energy of 2.25 eV, and the emission of the TTA material emission near 450 nm corresponds to an energy of 2.76 eV. Therefore, the blue light comes from a triplet energy transfer from the exciplex to the TTA material through the TTAUC.

Figure 5:
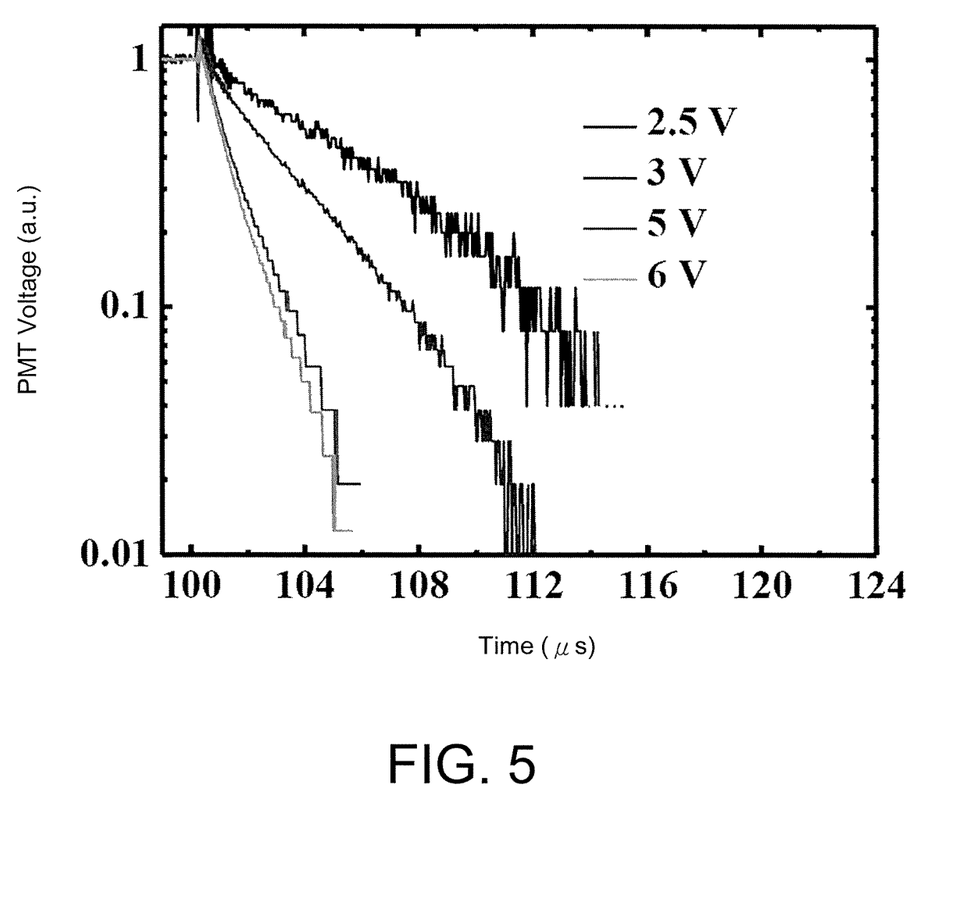
FIG. 5 is a diagram illustrating characteristics of a turning-off moment of an OLED according to Experimental Example 1 of the disclosure.
Figure 6:
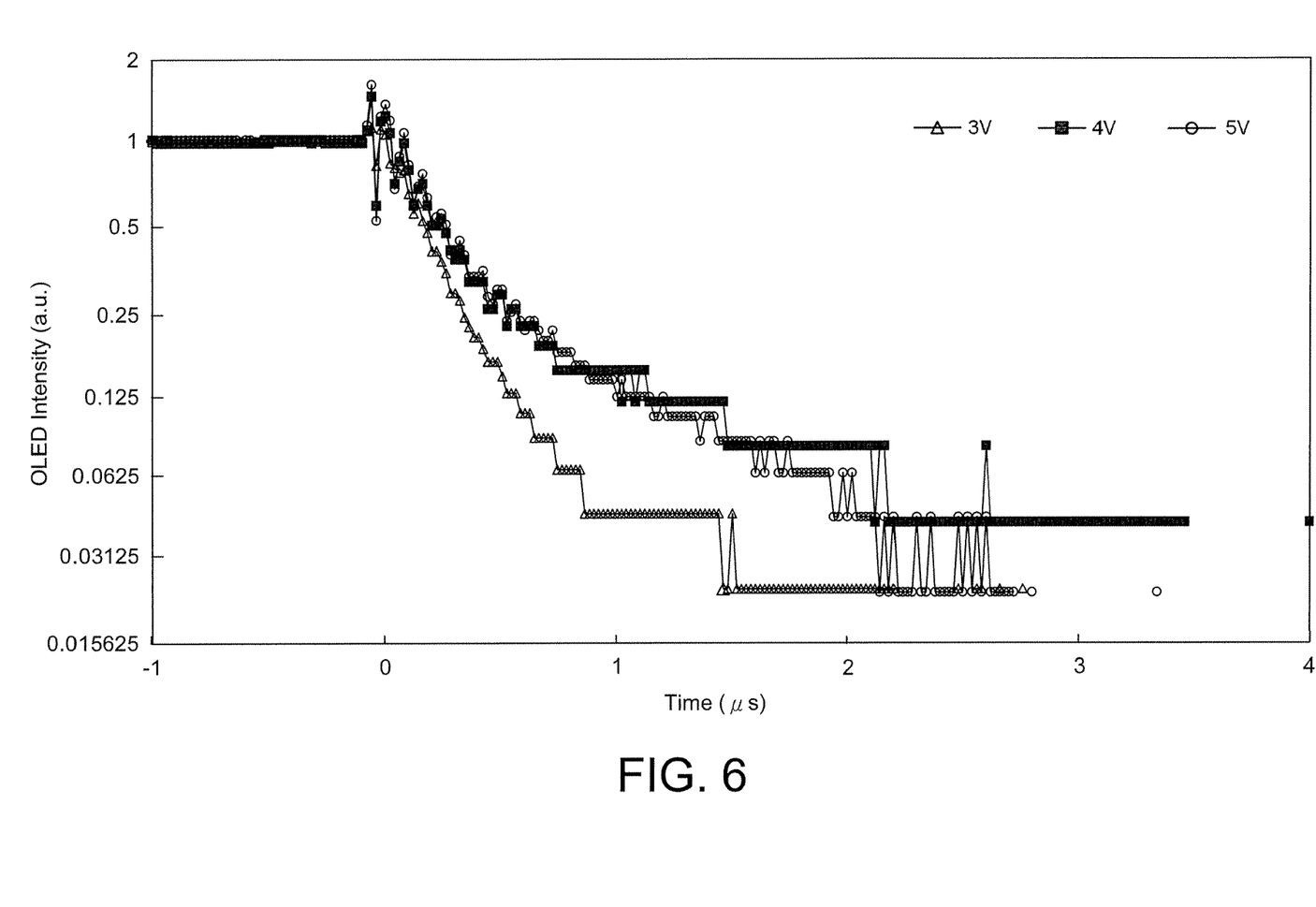
FIG. 6 is a diagram illustrating characteristics of a turning-off moment of an OLED according to Comparative Example of the disclosure.

FIG. 5 is a diagram illustrating characteristics of a turning-off moment of an OLED according to Experimental Example 1, wherein the four lines sequentially arranged from left to right respectively correspond to 6V, 5V, 3V, and 2.5V. FIG. 6 is a diagram illustrating characteristics of a turning-off moment of an OLED according to Comparative Example; FIG. 6 is a diagram illustrating a turning-off moment within a wavelength range of the blue light.

Please refer to FIG. 5 and FIG. 6. Characteristics of turning-off moments within the wavelength ranges of the blue lights in Experimental Example 1 and Comparative Example can be observed. As shown in FIG. 6, it can be seen that when the OLED of the Comparative Example is turned off, the light intensity suddenly decreases, which results from the singlet energy. The light intensity then slowly decreases due to the long exciton lifetime of the triplet exciton. In comparison, in the OLED according to Experimental Example 1 of the embodiment, the slow decrease in the light intensity is also observed in FIG. 5, while no fast decrease in the light intensity is shown, which indicates that emissions all result from the triplet energy rather than the singlet energy.

Figure 7:
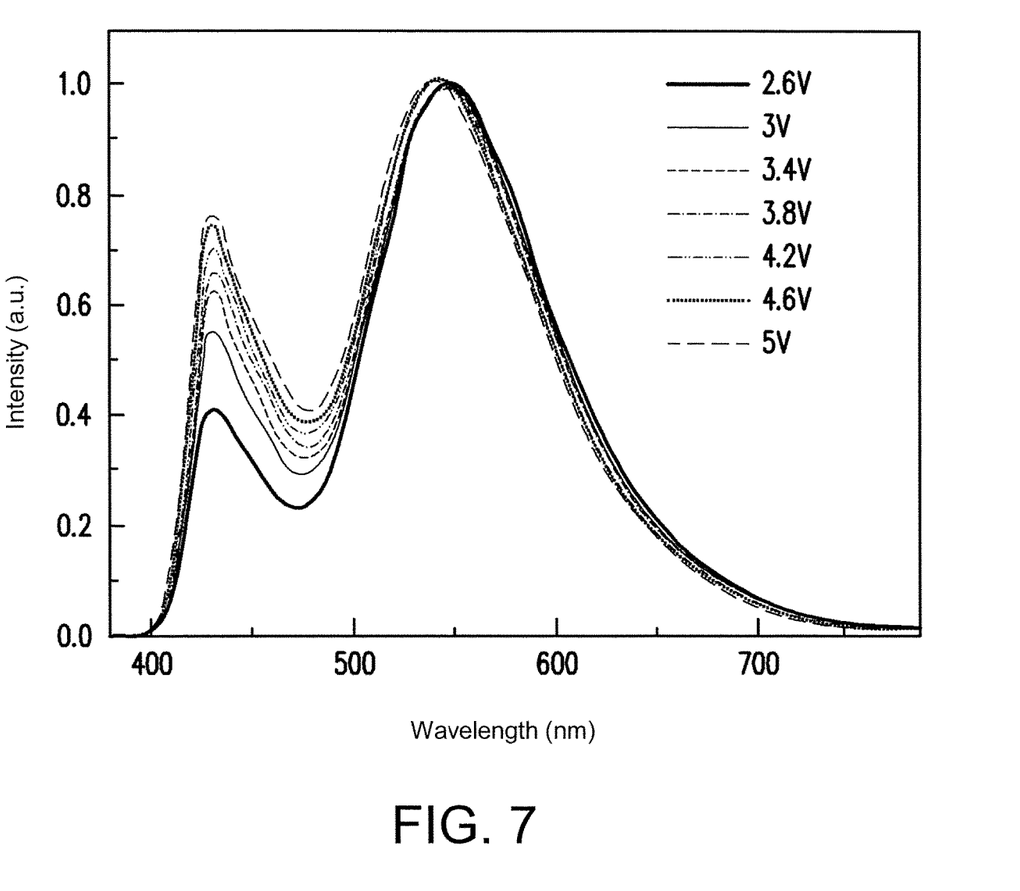
FIG. 7 illustrates a spectrum of an OLED changing along with variations in voltages according to Experimental Example 1 of the disclosure.
Figure 8:
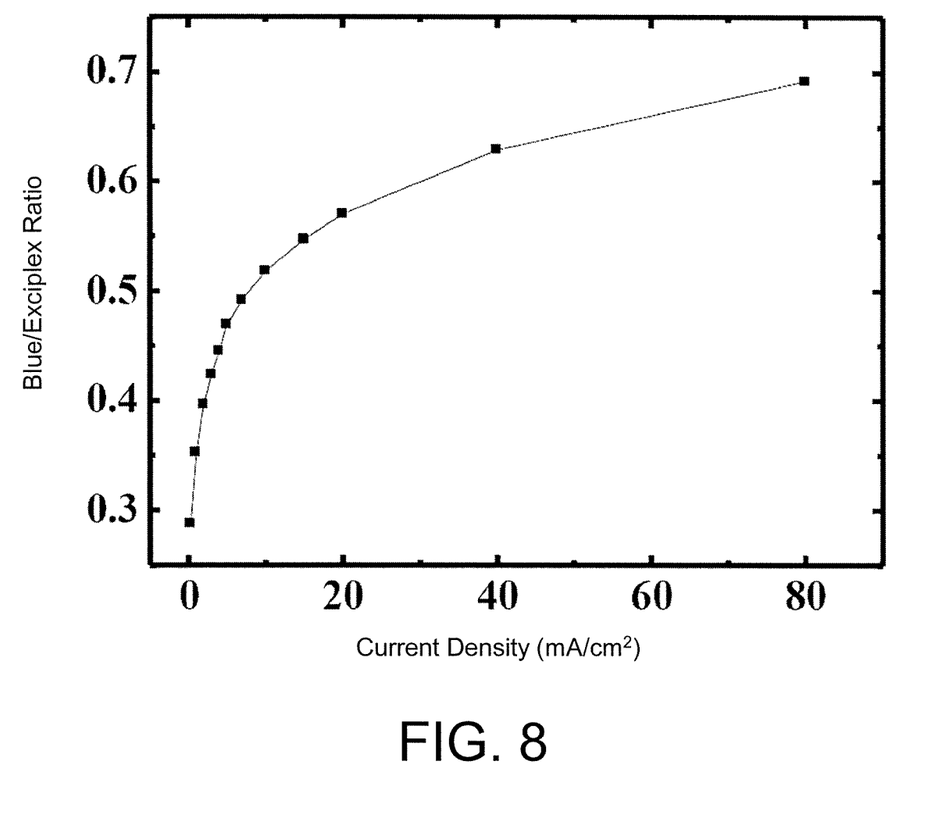
FIG. 8 is a diagram illustrating a light emission proportion of a blue light to a yellow light in an OLED under different current densities according to Experimental Example 1 of the disclosure.

FIG. 7 illustrates a spectrum of an OLED changing along with variations in voltages according to Experimental Example 1. FIG. 8 is a diagram illustrating a light emission proportion of a blue light to a yellow light in an OLED under different current densities according to Experimental Example 1.

Referring to FIG. 7, spectrum changes may be seen together with variations in voltages. Along with an increase in the current, a ratio of the blue light increases considerably, which proves the contribution of the triplet energy. Moreover, in FIG. 8, it can also be seen that along with the increase in the density of the current, an emission percentage of the blue light to the yellow light is also on the rise.

Table 2 lists values of the singlet and triplet energy levels of each material of an OLED according to Experimental Example 2 and Experimental Example 3.

TABLE 2

|  | Donor Material (m-MTDATA) | TTA Material (rubrene) | TTA Material (DCJTB) | Electron Transport Layer (Bphen) |
| --- | --- | --- | --- | --- |
| $S_1$ (eV) | 3.1 | 2.2 | 2.0 | 3.5 |
| $T_1$ (eV) | 2.7 | 1.1 | Not measured* | 2.5 |

*Generally speaking, the triplet energy level of DCJTB is less than 2.2 eV and greater than 1.1 eV.

Figure 9:
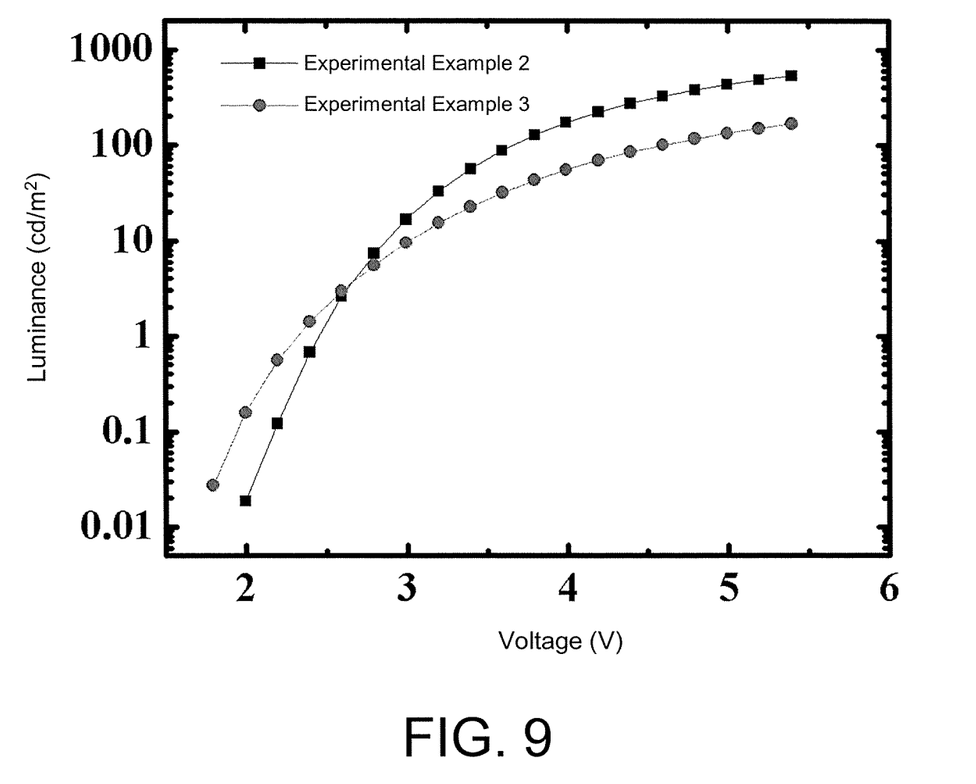
FIG. 9 is a voltage-luminance curve diagram of an OLED according to Experimental Example 2 and Experimental Example 3 of the disclosure.

FIG. 9 is a voltage-luminance curve diagram of an OLED according to Experimental Example 2 and Experimental Example 3.

Referring to FIG. 9, it can be seen that the OLEDs of Experimental Example 2 and Experimental Example 3 already begin to emit lights under around 2.0V and 1.8V, respectively. Driving voltages in Experimental Example 2 and Experimental Example 3 are less than a driving voltage in Comparative Example.

Figure 10:
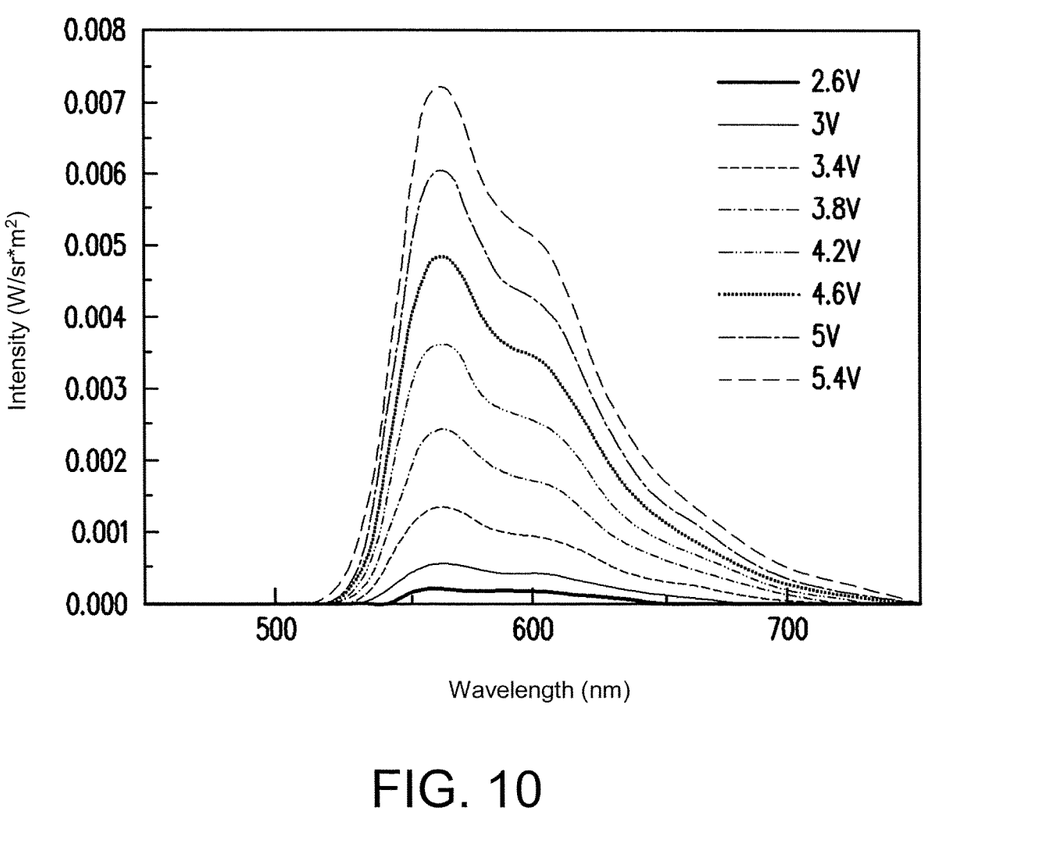
FIG. 10 illustrates a spectrum of an OLED changing along with variations in voltages according to Experimental Example 2 of the disclosure.
Figure 11:
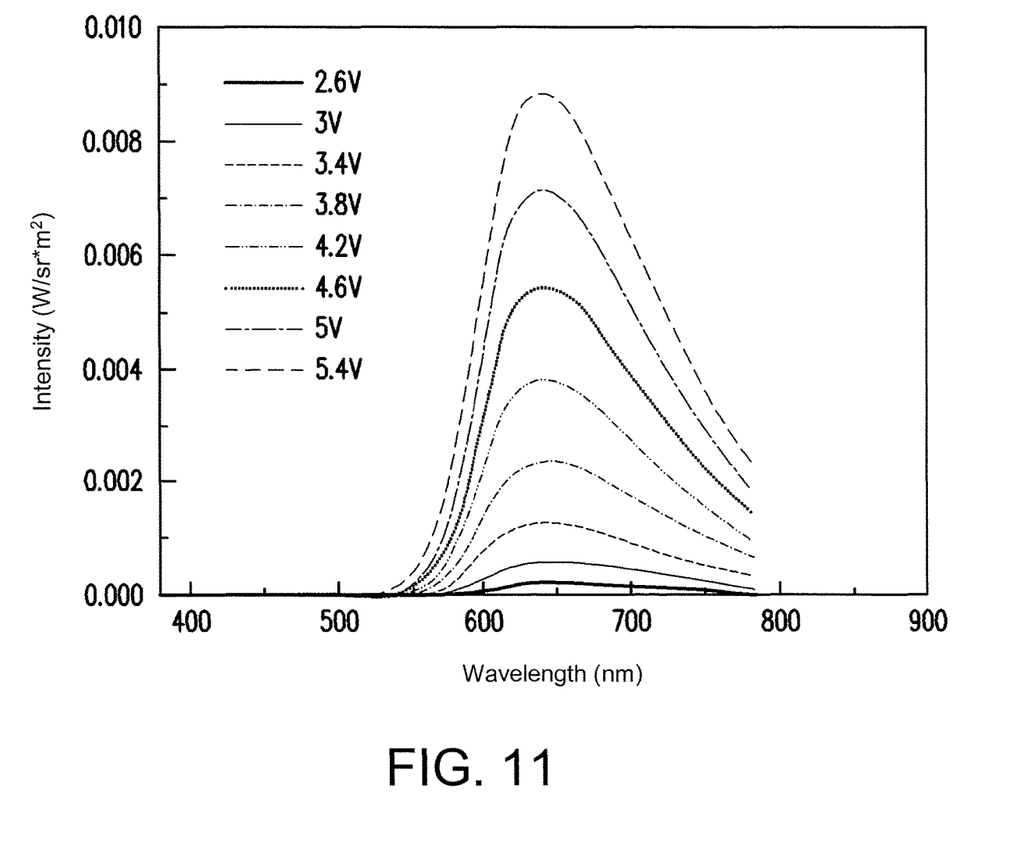
FIG. 11 illustrates a spectrum of an OLED changing along with variations in voltages according to Experimental Example 3 of the disclosure.

FIG. 10 illustrates a spectrum of an OLED changing along with variations in voltages according to Experimental Example 2. FIG. 11 illustrates a spectrum of an OLED changing along with variations in voltages according to Experimental Example 3.

Referring to FIG. 10 and FIG. 11, spectrum changes may be seen together with variations in voltages. The intensity in the region of yellow green light in FIG. 10 increases considerably along with the increase in the voltage, and the intensity in the region of red light in FIG. 11 increases considerably along with the increase in the current, which proves the contribution of the triplet energy.

In view of the foregoing, the electroluminescence mechanism is applied by the OLED in the embodiments of the disclosure. The sensitizer sensitizing a series of reactions may be formed while a low driving voltage is applied, and the triplet energy of the sensitizer is transferred to the TTA material for the TTAUC. Since the energy of the sensitizer is fully utilized, the power efficiency is thereby significantly increased. Moreover, the OLED in the embodiment of the disclosure emits light with the singlet energy having a short exciton lifetime (~ns); hence, the exciton-polaron annihilation behavior is considerably reduced, and a light-emitting lifetime is enhanced. In addition, the OLED in the embodiments of the disclosure has the sensitizer and the TTA material that emit lights, the while OLED with high efficiency and long lifetime is thus further formed by mixing the color lights to generate the white light.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An organic light-emitting diode (OLED), comprising:
an anode;
a cathode;
an emission layer, disposed between the anode and the cathode and comprising:
a triplet-triplet annihilation (TTA) material, the TTA material having a first singlet energy and a first triplet energy, a doubled first triplet energy being greater than the first singlet energy; and
a donor material, disposed between the anode and the TTA material and having a second singlet energy and a second triplet energy;
an electron transport layer, disposed between the cathode and the emission layer; and
a sensitizer, doped in the emission layer or formed between the TTA material and the donor material when a voltage is applied, wherein the sensitizer has a third singlet energy and a third triplet energy, the third singlet energy and the third triplet energy are both smaller than the second singlet energy, the third singlet energy emits a first color light, and the third triplet energy is transferred to the TTA material for sensitizing a triplet-triplet annihilation up-conversion, such that the first singlet energy emits a second color light.

2. The OLED according to claim 1, wherein the third singlet energy and the third triplet energy are both between the first singlet energy and the first triplet energy.

3. The OLED according to claim 1, wherein the sensitizer is an exciplex, and the exciplex is formed between the TTA material and the donor material when a voltage is applied.

4. The OLED according to claim 3, wherein the donor material comprises 4,4',4"-tris(3-3-methylphenylphenyl amino)triphenylamine, N1,N1'-(biphenyl-4,4'-diyl) bis(N1-phenyl-N4,N4-di-m-tolylbenzene-1,4-diamine), 4,4',4"-tris(N-(naphthalen-1-yl)-N-phenyl-amino)triphenylamine, or 4,4',4"-tris(2-naphthyl (phenyl)amino)triphenylamine.

5. The OLED according to claim 3, wherein the second color light comprises a red light, a yellow light, a yellow green light, or a blue light.

6. The OLED according to claim 1, wherein the emission layer further comprises a dopant, the dopant has a fifth singlet energy and a fifth triplet energy, and the fifth singlet energy and the fifth triplet energy are both smaller than the first singlet energy.

7. The OLED according to claim 6, wherein the dopant comprises a blue fluorescent dopant or a red fluorescent dopant.

8. The OLED according to claim 7, wherein the blue fluorescent dopant comprises 4,4'-bis(4-diphenylaminostyryl)biphenyl or 1,4,7,10-Tetra(tert-butyl)perylene.

9. The OLED according to claim 7, wherein the red fluorescent dopant comprises pentacene or 4-(Dicyanomethylene)-2-tert-butyl-6-(1,1,7,7-tetramethyljulolidin-4-yl-vinyl)-4H-pyran.

10. The OLED according to claim 1, wherein the TTA material comprises rubrene.

11. The OLED according to claim 1, wherein the TTA material comprises anthracene derivative, pyrene derivative, or perylene derivative.

12. The OLED according to claim 11, wherein the anthracene derivative comprises 9,10-Di(2-naphthyl)anthracene, 2-ethyl-9,10-Di(2-naphthyl)anthracene, 2-tert-butyl-9,10-Di(2-naphthyl)anthracene, or 9,9'-dianthracene.

13. The OLED according to claim 1, wherein an electron mobility of the electron transport layer is greater than $10^{-6}$ cm/Vs.

14. A white organic light-emitting diode, comprising:
an anode;
a cathode;
an emission layer, disposed between the anode and the cathode and comprising:
 a triplet-triplet annihilation (TTA) material, the TTA material having a first singlet energy and a first triplet energy, a doubled first triplet energy being greater than the first singlet energy; and
 a donor material, disposed between the anode and the TTA material and having a second singlet energy and a second triplet energy;
an electron transport layer, disposed between the cathode and the emission layer; and
a sensitizer, doped in the emission layer or formed between the TTA material and the donor material when a voltage is applied, wherein the sensitizer has a third singlet energy and a third triplet energy, and the third singlet energy and the third triplet energy are both smaller than the second singlet energy,
wherein the third singlet energy emits a yellow light or a yellow green light, the third triplet energy is transferred to the TTA material for sensitizing a triplet-triplet annihilation up-conversion, such that the first singlet energy emits a blue light, and a white light is generated by mixing the yellow light with the blue light or mixing the yellow green light with the blue light.

15. The white organic light-emitting diode according to claim 14, wherein the third singlet energy and the third triplet energy are both between the first singlet energy and the first triplet energy.

16. The white organic light-emitting diode according to claim 14, wherein the sensitizer is an exciplex, and the exciplex is formed between the TTA material and the donor material when a voltage is applied.

17. The white organic light-emitting diode according to claim 14, wherein the emission layer further comprises a dopant, the dopant has a fifth singlet energy and a fifth triplet energy, and the fifth singlet energy and the fifth triplet energy are both smaller than the first singlet energy.

18. The white organic light-emitting diode according to claim 17, wherein the dopant comprises a blue fluorescent dopant or a red fluorescent dopant.

19. The white organic light-emitting diode according to claim 18, wherein the blue fluorescent dopant comprises 4,4'-bis(4-diphenylaminostyryl)biphenyl or 1,4,7,10-Tetra(tert-butyl)perylene.

20. The white organic light-emitting diode according to claim 18, wherein the red fluorescent dopant comprises pentacene or 4-(Dicyanomethylene)-2-tert-butyl-6-(1,1,7,7-tetramethyljulolidin-4-yl-vinyl)-4H-pyran.

21. The white organic light-emitting diode according to claim 14, wherein the TTA material comprises anthracene derivative, pyrene derivative, or perylene derivative.

22. The white organic light-emitting diode according to claim 21, wherein the anthracene derivative comprises 9,10-Di(2-naphthyl)anthracene, 2-methyl-9,10-Di(2-naphthyl)anthracene, 2-tert-butyl-9,10-Di(2-naphthyl)anthracene, or 9,9'-dianthracene.

23. The white organic light-emitting diode according to claim 14, wherein the donor material comprises 4,4',4''-tris(3-3-methylphenylphenyl amino)triphenylamine, N1,N1'-(biphenyl-4,4'-diyl) bis(N1-phenyl-N4,N4-di-m-tolylbenzene-1,4-diamine), 4,4',4''-tris(N-(naphthalen-1-yl)-N-phenyl-amino)triphenylamine, or 4,4',4''-tris(2-naphthyl(phenyl)amino)triphenylamine.

* * * * *